United States Patent [19]

Ashley et al.

[11] 4,415,852
[45] Nov. 15, 1983

[54] SINGLE HYBRID JUNCTION FREQUENCY DISCRIMINATOR

[75] Inventors: James R. Ashley, Tampa, Fla.; Thomas A. Barley; Gustaf J. Rast, Jr., both of Huntsville, Ala.

[73] Assignee: The United States of America as represented by the Secretary of the Army, Washington, D.C.

[21] Appl. No.: 315,328

[22] Filed: Oct. 26, 1981

[51] Int. Cl.³ .................. G01R 27/04; H01P 7/04
[52] U.S. Cl. .................... 324/57 N; 324/58 R; 333/223
[58] Field of Search ........... 324/58 R, 58 B, 57 N; 333/136, 137, 223–226, 253, 263

[56] References Cited

U.S. PATENT DOCUMENTS

| 3,079,563 | 2/1963 | Marsh et al. | 329/116 |
| 3,675,124 | 7/1972 | Ashley et al. | 324/57 |
| 4,002,970 | 1/1977 | Ashley et al. | 324/57 N |
| 4,002,971 | 1/1977 | Rast, Jr. et al. | 324/57 N |
| 4,034,285 | 7/1977 | Ashley et al. | 324/57 R |
| 4,048,568 | 9/1977 | Rast, Jr. et al. | 325/363 |
| 4,303,899 | 12/1981 | Barley | 333/263 X |

OTHER PUBLICATIONS

R. A. Campbell, "Stability Measurement Techniques in the Frequency Domain", *IEEE-NASA Symposium on Short Term Frequency Stability, NASA AP-80*, Nov. 23–24, 1964, pp. 231–235.

J. Nigrin et al., "Single Hybrid Tee Frequency Discriminator", *IEEE Transactions on Microwave Theory and Techniques*, vol. MTT-23, No. 9, Sep. 1975, pp. 776-778.

R. Knochel et al., "Comments on the Measurement of Noise in Microwave Transmitters", *IEEE Transactions on Microwave Theory and Techniques*, vol. MTT-27, No. 1, Jan. 1979.

*Primary Examiner*—Stanley T. Krawczewicz
*Assistant Examiner*—Jose M. Solis
*Attorney, Agent, or Firm*—Fred M. Bush; Robert P. Gibson; Anthony T. Lane

[57] ABSTRACT

A single hybrid junction discriminator is described for operation over a wide operating frequency range. The single hybrid discriminator uses a transmission line, phase shifters and fixed short circuits in providing a resonant cavity in the discriminator element to form a device that will measure near carrier frequency modulated noise on a carrier frequency. Only a minimum exchange of circuit components is required for changed carrier frequencies. With the phase shifter located in the signal channel, operation is a direct and easy process for quadrature detection. Component arrangement is critical to the operation of the single hybrid discriminator. The single hybrid discriminator is more sensitive than either the two hybrid or one hybrid and a directional coupler type discriminator because better usage is made of the available signal power.

8 Claims, 4 Drawing Figures

SINGLE HYBRID JUNCTION FREQUENCY DISCRIMINATOR

DEDICATORY CLAUSE

The invention described herein may be manufactured, used, and licensed by or for the Government for governmental purposes without the payment to us of any royalties thereon.

BACKGROUND OF THE INVENTION

In radio frequency signal generation and processing the reduction and suppression of noise is always a pertinent factor. In seeking to measure very low levels of intelligent signals, surrounding noise levels must be identified so that they can be reduced. Thus noise becomes the signal of interest in discrimination systems that determine noise levels that are ultimately to be removed or suppressed in signal processing. In related U.S. Pat. Nos. 4,002,970 and 4,002,971 issued to Ashley, Rast, and Barley, the present inventors, transmission line discrimination is disclosed in detail. In measuring frequency modulation noise on a continuous wave signal, the carrier signal is nulled in a discriminator section of the system. Subsequently, incidental amplitude modulation is rejected from the desired test signal and dynamic range of measurement is enhanced. In these patents, the use of an optimized transmission line discriminator circuit is set forth which allows measurement of the near carrier frequency modulation at microwave frequencies. Reference and signal channels of information are established for a signal under test. Routine calibration sequences are set forth for calibrating the systems. Additional background and prior art in the use of frequency discrimination to measure near carrier frequency modulation noise of a microwave signal is set forth in these patents and in the prior art references cited therein.

SUMMARY OF THE INVENTION

A single hybrid junction discriminator utilizes a 4 port, 3db, hybrid in establishing a signal channel and a reference channel for processing a signal of interest while discriminating against undesirable signals. The input signal of interest is coupled to a transmission line resonator discriminating circuit before entering the signal channel. The discriminating circuit utilizes as a preferred embodiment a tee junction, transmission line section, a pair of phase shifters and fixed short-circuits to provide a resonant cavity. Near carrier frequency modulated noise on a carrier frequency can readily be processed with high fidelity of the noise information.

DESCRIPTION OF THE PREFERRED EMBODIMENT

Figure 1:
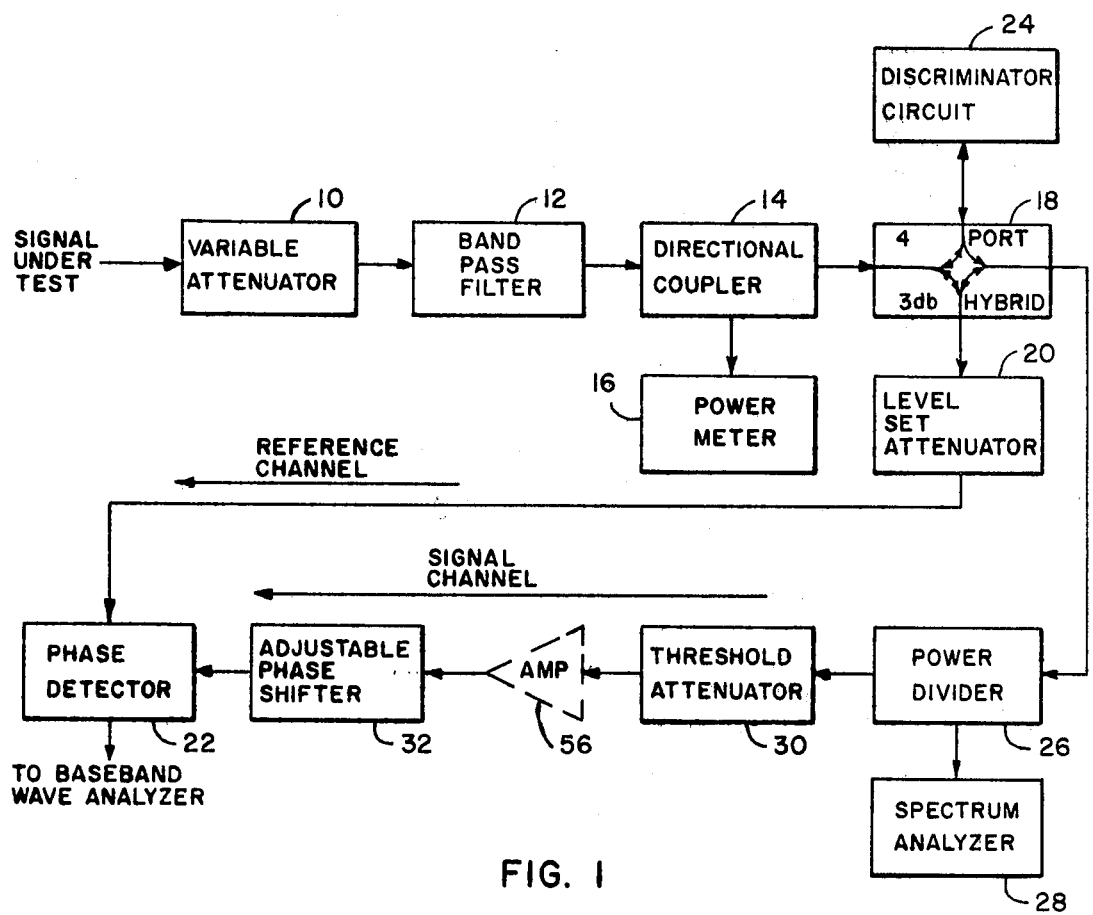
FIGS. 1 and 2 disclose a block diagram of a preferred embodiment of the discriminator.

Referring now to the drawings wherein like numbers represent like parts, FIG. 1 discloses a preferred embodiment. A signal whose FM sidebands are to be measured is coupled to the input port of a variable attenuator 10 which adjusts the magnitude of the incoming signal for further processing. The signal is coupled to bandpass filter 12 to remove all signals but the signal to be measured from the frequency spectrum viewed by this analyzer. The signal is coupled from filter 12 to directional coupler 14 which takes part of the signal power and routes it to power meter 16 for monitoring purposes. The main portion of the signal from directional coupler 14 is then passed to a four port hybrid 18 for further processing. Hybrid 18 is impedance matched to adjacent components, provides signal power routing and couples approximately one-half the input signal power to a level set attenuator 20 whose function is to adjust the portion of signal level that is routed therethrough as the reference channel signal. The reference channel signal is subsequently coupled to a phase detector 22. Hybrid 18 also couples the remaining part of the input signal to a discriminator circuit 24.

Discriminator 24 converts frequency variable to phase variable components. The signal that is returned to hybrid 18 from discriminator 24 is routed in two directions. One part of the signal couples back to the input of the analyzer and then reflects back from imperfectly matched componets through the hybrid into the reference channel. This signal is reduced in strength, is shifted in phase from the reference signal, and is now interference to the reference signal. For this reason a phase shifter cannot be used in the reference channel. This device can be properly adjusted for quadrature operation with the phase shifting function located in the signal channel path, and allows proper operation of this single hybrid circuit. The other part of the discriminator signal from hybrid 18 is routed to power divider 26, which could just as easily be a directional coupler. The signal is sampled by power divider 26 for RF spectrum analyzer 28 which is the device that is used to determine when appropriate adjustments are to be made in discriminator 24. The remainder of the signal from power divider 26 is sent to threshold attenuator 30. In normal measurement operation, threshold attenuator 30 is set for minimum insertion loss. However, when the equipment noise floor is to be measured, threshold attenuator 30 is set for maximum attenuation. The measurement at phase detector 22 established by this condition represents the internal noise floor of this discriminator system. The signal proceeds from threshold attenuator 30 either directly to a phase shifter 32 or through an amplifier 56 and then to phase shifter 32, depending on whether or not amplification is desired. Amplifier 56 is a low noise, high gain amplifier, as shown in dashed lines, where the amplifier gain is used to improve the sensitivity and dynamic range of the measurement. The placement of amplifier 56 is such that any noise generated by the amplifier is still in the circuit when threshold attenuator 30 is set for maximum attenuation. Thus the amplifier noise becomes part of the threshold measurement.

The function of phase shifter 32 is to establish a quadrature relationship between the reference channel signal and the signal channel signal. This phase adjusted signal from phase shifter 32 then proceeds to phase detector 22 where it combines with the reference channel signal to provide an output that is a video or baseband replica of the RF frequency modulation noise of the applied signal under test. Also, the AM components of the signal under test are suppressed by this quadrature phase relationship in the phase detector. The signal spectrum at the output of phase detector 22 is then applied to baseband analysis equipment to record the results.

Figure 2:
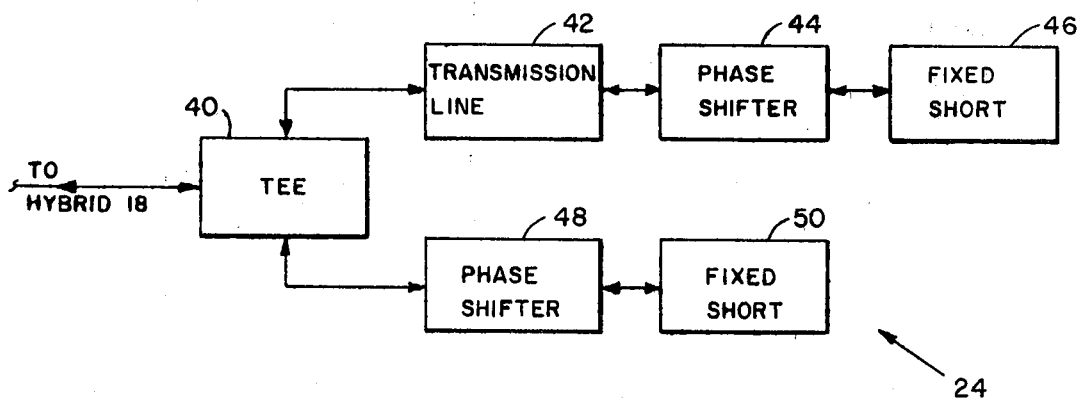

Discriminator circuit 24 effectively suppresses the carrier component, preventing this component from entering the signal channel. A preferred embodiment of the discriminator circuit is shown in FIG. 2. As shown in FIG. 2, the portion of input signal under test which is to be routed through the signal channel is coupled to a tee junction 40 which serves as the input-output of discriminator circuit 24. The tee is used to couple a part of the signal it receives to a section of transmission line 42 that may be one-half wavelength ($\lambda$) or longer. A convenient length to select for transmission line 42 is a length which may lie in the range of one-half db of one way attenuation at the signal frequency; however, the length is not critical.

Figure 4:
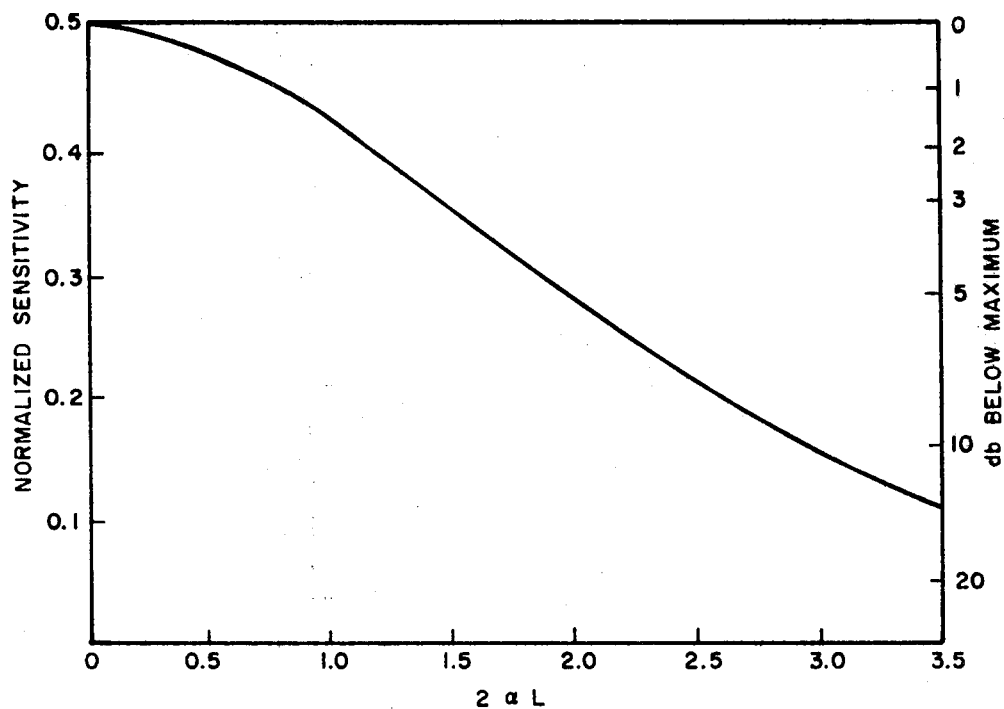
FIG. 4 is a graph of the discriminator normalized sensitivity versus transmission line length.

As shown in FIG. 4 the response curve of the discriminator circuit indicates that a precise length of line is not critical. For example, a line length of 0.5 neper has a decrease of sensitivity of less than $\frac{1}{2}$ db from maximum. The signal then proceeds to phase shifter 44 which is used to setup a nearly integral number of half-wavelengths in the line section between tee 40 and a fixed short-circuit 46. The signal proceeds through the phase shifter 44 to fixed short-circuit 46 where it is reflected back up the line path to tee 40. The other part of the signal that is routed out of tee 40 goes to a phase shifter 48 which is used as a means of adjusting the total phase shift between tee 40 and a fixed short-circuit 50. The signal proceeds from phase shifter 48 to fixed short-circuit 50 which reflects the signal back to the tee 40. The operation of the components that connect to tee 40 are the key to operation of this part of the device. The variable phase shifters 44 and 48 are adjusted to null the carrier component that would otherwise be returned from tee 40 to hybrid 18. In this cancellation process, a cavity is formed between fixed short-circuits 46 and 50 with tee 40 providing a means of coupling the signal into and out of the cavity. This cavity responds in the same manner as any multiple wavelength transmission line cavity that is a multiple number of half-wavelengths long. The cavity Q in this embodiment is not as high as the Q of a single half-wavelength cavity but, the total discriminator response is more easily tuned than with a single half-wavelength cavity. The resultant signal that does return from tee 40 has a heavily attenuated carrier amplitude, and frequency modulated components that have been converted to phase modulated components that go through to complete the process of discrimination. Both of these functions are desirable to increase FM detection densitivity and separate the AM and FM sidebands for accurate, reliable measurement.

Coaxial components are generally used for the discriminator circuit at lower frequencies and waveguides are used at higher frequencies. A typical frequency transition point may be 10 GHz.

Figure 3:
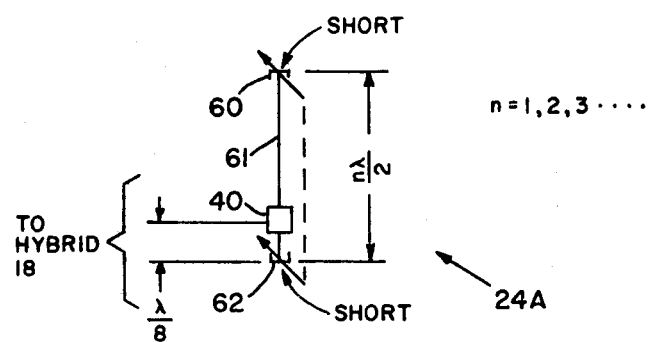
FIG. 3 is an alternative embodiment of the discrimination circuit for the discriminator of FIG. 1.

In the embodiment of FIG. 3 the discriminator circuit 24 of FIG. 1 is replaced by discriminator 24A. Circuit operation for the system remains the same except that discriminator 24A involves n halfwave resonant transmission line where n can be one, or any other positive integer. Maximum discriminator sensitivity is obtained when n=1; however, circuit tuning is the most difficult to accomplish in this embodiment when n=1. In discriminator 24A the resonant circuit comprises a transmission line 61 with adjustable short-circuits 60 and 62 at the ends thereof. The starting point for adjustment is to set the spacing between one of the shorts and tee 40 to approximately $\frac{1}{8}$ wavelength where the total length of the transmission line is n half wavelengths.

In the tuning process with the signal coming from hybrid 18 to discriminator 24A an n half-wavelength transmission line section 61 is implemented wherein the resonator is formed by this transmission line section. The correct resonant frequency is attained by properly adjusting the two end short-circuits 60 and 62 to be n half wavelengths long.

The cricital coupling as determined by a carrier null observed by spectrum analyzer 28 is obtained by the correct adjustment of the distance from the tee 40 to the closer shorted end of transmission line 61. Simultaneously coordinated movement of these short-circuits will provide the desired resonant frequency, and critical coupling. The signal returned to hybrid 18 is then processed in the same manner as previously set forth with or without amplifier 56.

Applicants have a related patent application currently copending which discloses a high frequency resonator which may be used in the embodiment of FIG. 3 as discriminator 24A. This application is Ser. No. 146,804, filed May 5, 1980 and entitled "Matched High Q, High Frequency Resonators" now U.S. Pat. No. 4,303,899 issued Dec. 1, 1981.

Obviously modification and variation of the present invention is possible in light of the above disclosure. For example, the discriminator circuits use short circuits. The high current points of interest occur at the short circuits. A variable short circuit has more losses than a fixed short and the cavity Q is not as good as the fixed short. Therefore, while a variable short can be used in all cases, the tuning would be harder to achieve and the losses would be higher. Similarly, the variable short circuits used in FIG. 3, may be fixed shorts if they are used in conjunction with a short length of adjustable line or a phase shifter, for phase shifting to provide matching. It is, therefore, to be understood that within the scope of the appended claims, the invention may be practiced otherwise than as specifically disclosed herein.

We claim:

1. A discriminator for measuring input frequency modulation noise signals comprising:
   a bandpass filter having an input and an output, said input being adapted to receive input signals;
   signal routing means having a plurality of input-output ports, a first port of said ports being coupled to the output of said bandpass filter for receiving noise signals therefrom;
   a discriminator circuit means having an input-output port coupled to a second port of said signal routing means ports for receiving signals from said second port and directing signals back thereto;
   a first signal channel having an input and an output, said input being coupled to a third port of said signal routing means for receiving said signals from said discriminator circuit means coupled to said signal routing means second port;
   quadrature detection means having first and second inputs and an output, said first input being coupled to the output of said first channel, and the output being adapted for coupling output measurement signals therefrom; and
   a second signal channel having an input and an output, said input being coupled to a fourth port of said signal routing means, and said output being coupled to said second input of said quadrature detection means for providing a reference channel input, to said quadrature detection means.

2. A discriminator as set forth in claim 1 wherein said first signal channel comprises, coupled in series, a power divider, a threshold attenuator and an adjustable phase shifter, said power divider having an input coupled as said first signal channel input and said adjustable phase shifter having an output coupled as said first signal channel output; said first signal channel further comprising a spectrum analyzer coupled to said power divider.

3. A discriminator as set forth in claim 2 wherein said second signal channel comprises a level set attenuator.

4. A discriminator as set forth in claim 3 wherein said discriminator circuit means comprises a tee junction having first, second, and third input-output ports, said first tee junction port being coupled as said discriminator circuit means input-output port; a phase shifter and a transmission line short circuit coupled in series, with said phase shifter being coupled to said second input-output port of the tee junction; and a transmission line section and a second transmission line short circuit coupled in series, with said transmission line section being coupled to said third input-output port of the tee junction.

5. A discriminator as set forth in claim 4 wherein said discriminator circuit means further comprises a second phase shifter, said second phase shifter being coupled between said transmission line section and said second transmission line short-circuit.

6. A discriminator as set forth in claim 5 wherein said tee junction, phase shifter and transmission line section is coaxial.

7. A discriminator as set forth in claim 3 wherein said discriminator circuit means comprises a transmission line having an overall electrical length of $(n\lambda/2)$, where n is any whole number and $\lambda$ is the wavelength of a predetermined carrier frequency; and first and second adjustable shorting stubs coupled to respective ends of said transmission line.

8. A discriminator as set forth in claim 2 wherein said first signal channel further comprises an amplifier coupled between said threshold attenuator and said adjustable phase shifter.

* * * * *